(12) United States Patent
Xu

(10) Patent No.: US 11,177,424 B2
(45) Date of Patent: Nov. 16, 2021

(54) DUAL IN-LINE PACKAGE LED DEVICE

(71) Applicant: Xiaojun Xu, Jiangmen (CN)

(72) Inventor: Xiaojun Xu, Jiangmen (CN)

(*) Notice: Subject to any disclaimer, the term of this patent is extended or adjusted under 35 U.S.C. 154(b) by 227 days.

(21) Appl. No.: 16/713,022

(22) Filed: Dec. 13, 2019

(65) Prior Publication Data

US 2020/0395518 A1 Dec. 17, 2020

(30) Foreign Application Priority Data

Jun. 15, 2019 (CN) .......................... 201920904755.2

(51) Int. Cl.
| | |
|---|---|
| *H01L 33/62* | (2010.01) |
| *F21V 19/00* | (2006.01) |
| *H01L 33/56* | (2010.01) |
| *F21Y 115/10* | (2016.01) |

(52) U.S. Cl.
CPC ............ *H01L 33/62* (2013.01); *F21V 19/002* (2013.01); *H01L 33/56* (2013.01); *F21Y 2115/10* (2016.08)

(58) Field of Classification Search
CPC ......... H01L 33/62; H01L 33/56; H01L 33/54; F21V 19/002; F21Y 2115/10; F21K 9/232
See application file for complete search history.

(56) References Cited

U.S. PATENT DOCUMENTS

| | | | | |
|---|---|---|---|---|
| 5,025,305 | A | * | 6/1991 | Tomisawa ............. G01J 1/0403 257/696 |
| 2015/0098206 | A1 | * | 4/2015 | Pickard ..................... F21K 9/23 362/84 |
| 2015/0280093 | A1 | * | 10/2015 | Tomita .................... H01L 24/06 257/88 |

\* cited by examiner

*Primary Examiner* — Kevin Quarterman

(57) ABSTRACT

A dual in-line package (DIP) light emitting diode (LED) device includes a molded member, a positive lead passing through and fixed to the molded member, the positive lead comprising an upper end and lower end, a negative lead passing through and fixed to the molded member, the negative lead comprising an upper end and lower end, and at least one LED body connected to the top ends of the positive lead and the negative lead. The lower ends of the positive lead and the negative lead are flush with each other. The top end of the positive lead is higher than the top end of the negative lead. The positive lead and the negative lead are both bent at the top ends thereof.

6 Claims, 4 Drawing Sheets

DUAL IN-LINE PACKAGE LED DEVICE

CROSS REFERENCE TO RELATED APPLICATIONS

This application claims priority to Chinese Patent Application No. 201920904755.2, filed Jun. 15, 2019, which is hereby incorporated by reference herein as if set forth in its entirety.

BACKGROUND

1. Technical Field

The present disclosure generally relates to light emitting diodes (LEDs), and particularly to a dual in-line package (DIP) LED device.

2. Description of Related Art

Dual in-line package (DIP) light emitting diodes (LEDs) are known. One problem of some conventional DIP LEDs is that the manufacturing process is relatively complicated, which increases the manufacturing cost.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
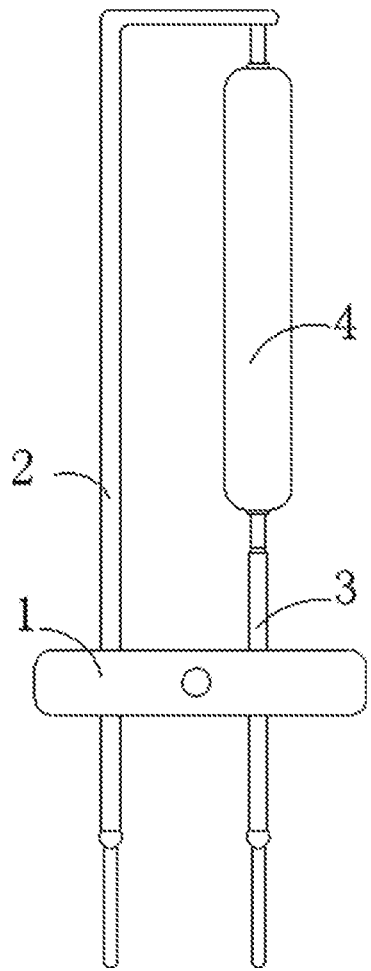
FIG. 1 is a schematic planar view of a DIP LED device according to an embodiment.
Figure 2:
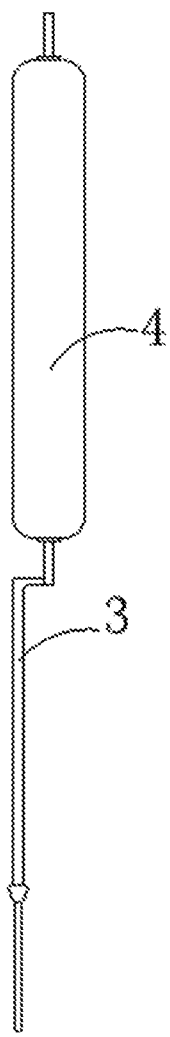
FIG. 2 is a side view of the DIP LED device of FIG. 1, with certain components omitted for clarity.
Figure 3:
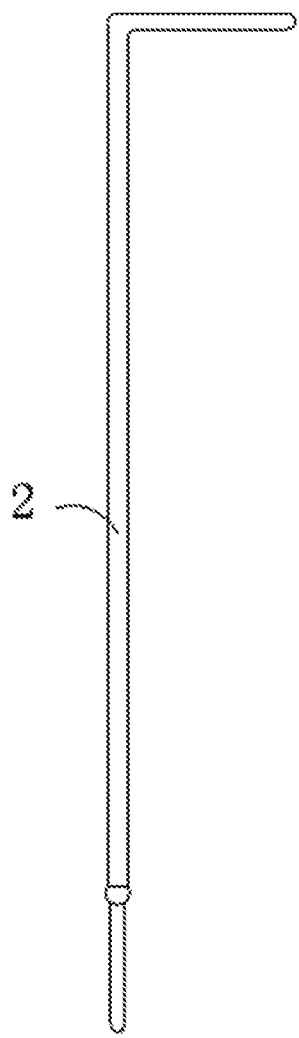
FIG. 3 is a schematic planar view of a positive lead of the DIP LED device of FIG. 1.

The disclosure is illustrated by way of example and not by way of limitation in the figures of the accompanying drawings, in which like reference numerals indicate similar elements. It should be noted that references to "an" or "one" embodiment in this disclosure are not necessarily to the same embodiment, and such references can mean "at least one" embodiment.

The terms "upper", "lower", "left" and "right", indicating the orientational or positional relationship based on the orientational or positional relationship shown in the drawings, are merely for convenience of description, but are not intended to indicate or imply that the device or elements must have a particular orientation or be constructed and operated in a particular orientation, and therefore should not be construed as limiting the present invention. The terms "first" and "second" are used for descriptive purposes only and are not to be construed as indicating or implying relative importance or implicitly indicating the number of technical features. The meaning of "multiple" is two or more, unless expressly stated otherwise.

Referring to FIGS. 1-4, in one embodiment, an LED device includes a molded member 1, a positive lead 2, a negative lead 3, and an LED body 4. The molded member 1 is electrically insulative and made by plastic injection molding. The molded member 1 is elongated. The positive lead 2 and the negative lead 3 both pass through and are fixed to the molded member 1. The positive lead 2 and the negative lead 3 are both made of conductive metal sheet and parallel to each other, which can guarantee the stable mating performance of the positive lead 2 and negative lead 3 and the socket of an LED lamp. The lower ends of the positive lead 2 and the negative lead 3 are flush with each other. The top end of the positive lead 2 is higher than the top end of the negative lead 3. The positive lead 2 and the negative lead 3 are both bent at the top ends thereof.

The LED body 4 is connected to the top ends of the positive lead 2 and the negative lead 3. The LED body 4 is elongated and includes two conductive members at opposite ends thereof. The top ends of the positive lead 2 and the negative lead 3 are respectively soldered to the two conductive members, which achieves fast and stable connection between the LED body 4 with the positive lead 2 and the negative lead 3. The LED body 4 extends in a direction parallel to the positive lead 2 and the negative lead 3. After the LED body 4 is soldered to the upper ends of the positive lead 2 and the negative lead 3 through its conductive members, the molded member 1 is connected to the positive lead 2 and the negative lead 3 through a plastic injection molding machine. It should be noted that the LED body 4 includes an epoxy lens, a semiconductor die, and a wire bond, etc., which is known for a person skilled in the art and will not be described in detail herein.

Figure 4:
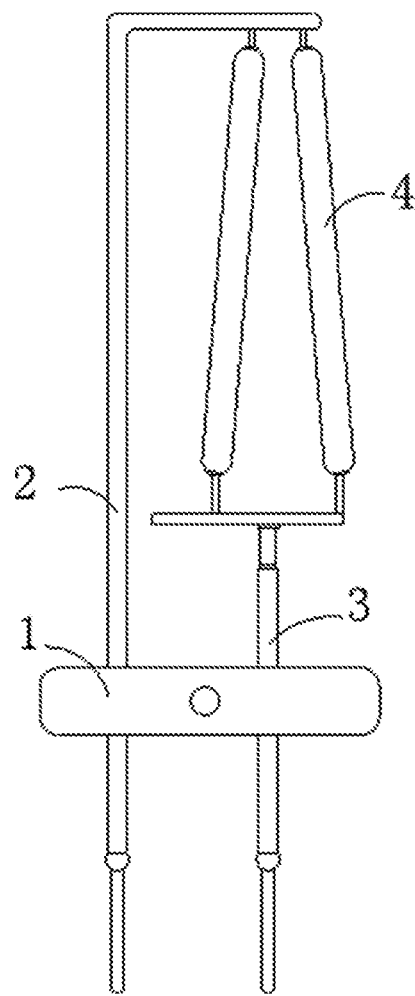
FIG. 4 is a schematic planar view of a DIP LED device according to an alternative embodiment.

In an alternative embodiment as shown in FIG. 4, there may be two LED bodies 4, each of which has two opposite ends that are respectively connected to top ends of the positive lead 2 and the negative lead 3.

During manufacture, the top ends of the positive lead 2 and the negative lead 3 are respectively soldered to the conductive members of the LED body 4, and then the molded member 1 is formed by plastic injection molding. The operation is simple and convenient, thereby effectively reducing the cost of equipment processing.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A dual in-line package (DIP) light emitting diode (LED) device comprising:
    a molded member;
    a positive lead passing through and fixed to the molded member, the positive lead comprising an upper end and lower end;
    a negative lead passing through and fixed to the molded member, the negative lead comprising an upper end and lower end; and
    at least one LED body connected to the top ends of the positive lead and the negative lead;
    wherein the lower ends of the positive lead and the negative lead are flush with each other, the top end of the positive lead is higher than the top end of the negative lead, the positive lead and the negative lead are both bent at the top ends thereof.

2. The DIP LED device according to claim 1, wherein the positive lead and the negative lead are both made of metal sheet and parallel to each other.

3. The DIP LED device according to claim 1, wherein each of the at least one LED body is elongated and comprises two conductive members at opposite ends thereof, and the top ends of the positive lead and the negative lead are respectively soldered to the two conductive members.

4. The DIP LED device according to claim 1, wherein the molded member is electrically insulative and made by plastic injection molding.

5. The DIP LED device according to claim 1, wherein the at least one LED body extends in a direction parallel to the positive lead and the negative lead.

6. The DIP LED device according to claim 1, wherein a number of the at least one LED body is one or two.

* * * * *